(12) United States Patent
Yagi et al.

(10) Patent No.: US 6,880,244 B2
(45) Date of Patent: Apr. 19, 2005

(54) CIRCUIT BOARD HAVING SIMULTANEOUSLY AND UNITARILY FORMED WIRING PATTERNS AND PROTRUSIONS

(75) Inventors: Yuji Yagi, Osaka (JP); Takeo Yasuho, Neyagawa (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/754,133

(22) Filed: Jan. 5, 2001

(65) Prior Publication Data

US 2001/0001428 A1 May 24, 2001

Related U.S. Application Data

(62) Division of application No. 09/332,968, filed on Jun. 15, 1999, now Pat. No. 6,218,736.

(30) Foreign Application Priority Data

Jun. 15, 1998 (JP) ............................................. 10-166648
Dec. 15, 1998 (JP) ........................................... 10-355837

(51) Int. Cl.[7] ................................................ H01K 3/22
(52) U.S. Cl. ............................. 29/851; 29/846; 29/825; 29/831; 228/254; 257/690; 257/668; 257/739; 257/737; 257/701; 361/720
(58) Field of Search .......................... 29/846, 849, 851, 29/825, 831; 228/254; 257/778, 697, 689, 690, 693, 668, 683, 686, 699, 739, 737, 673, 671, 784, 787, 793, 701; 361/720

(56) References Cited

U.S. PATENT DOCUMENTS

| | | | |
|---|---|---|---|
| 5,547,530 A | | 8/1996 | Nakamura et al. |
| 5,670,418 A | | 9/1997 | Ghosal |
| 5,718,367 A | * | 2/1998 | Covell, II et al. .......... 228/254 |
| 5,746,868 A | * | 5/1998 | Abe ........................... 156/247 |
| 5,796,590 A | | 8/1998 | Klein |
| 5,811,317 A | | 9/1998 | Maheshwari et al. |
| 5,819,579 A | * | 10/1998 | Roberts ....................... 72/412 |
| 5,874,780 A | * | 2/1999 | Murakami ................... 257/775 |
| 5,973,405 A | | 10/1999 | Keukelaar et al. |
| 6,132,543 A | * | 10/2000 | Mohri et al. ............. 156/89.12 |
| 6,482,676 B1 | * | 11/2002 | Tsunoi et al. ............... 438/108 |

FOREIGN PATENT DOCUMENTS

EP 0582052 2/1994

* cited by examiner

*Primary Examiner*—Richard Chang
(74) *Attorney, Agent, or Firm*—Parkhurst & Wendel, L.L.P.

(57) ABSTRACT

Method of manufacturing a circuit board and semiconductor device wherein the circuit board has a plurality of wiring patterns and protrusions located on the wiring patterns, the method including simultaneously and unitarily forming the wiring patterns and protrusions, and alternatively coupling electrically the protrusions with electrodes on a semiconductor chip component when present.

13 Claims, 14 Drawing Sheets

PRIOR ART

CIRCUIT BOARD HAVING SIMULTANEOUSLY AND UNITARILY FORMED WIRING PATTERNS AND PROTRUSIONS

This is a Division of application Ser. No. 09/332,968 filed Jun. 15, 1999 now U.S. Pat. No. 6,218,736.

FIELD OF THE INVENTION

The present invention relates to circuit boards and semiconductor devices used in information and communication equipment and a method of manufacturing the same.

BACKGROUND OF THE INVENTION

In recent years, semiconductor devices have been required to be smaller, thinner, lighter in weight and cheaper in cost in response to the development of information and communication equipment and technical advancements such as a higher speed of signal processing as well as employing a higher frequency. Semiconductor devices as small as a semiconductor IC (bare chip) are proposed in various forms.

FIG. 8 and FIG. 9 illustrate a general construction of a semiconductor device, i.e. electrode pad 103a is disposed on board 101 so that pad 103a faces to electrode 106 of semiconductor IC 105. Further, wiring pattern 102 is provided with pad 103a in order to electrically couple pad 103a to a mother board (not shown). Electrode 106 of semiconductor IC 105 is coupled to electrode pad 103a of board 101 via protrusion 103b such as a semiconductor bump formed on each electrode 106. Protrusions 103b are formed on respective electrodes 106 individually by using bump-forming-apparatus 110 shown in FIG. 10.

In the conventional construction discussed above, protrusions 103b are individually formed on respective electrodes 106. This time consuming process prevents a forming time from being shortened. As a result, this type of construction has been a bottleneck for reducing the cost of semiconductor devices. Further, respective protrusions 103b are desirably formed in an identical shape and at the same height so that electrode 106 of IC 105 can be perfectly conductive with electrode pad 103a of board 101. However, the conventional method discussed above rarely produces protrusions 103b in the identical shape.

SUMMARY OF THE INVENTION

The present invention addresses the problems discussed above. It provides circuit boards having protrusions with the same shape as well as semiconductor devices employing the circuit board, and realizes a method of manufacturing the same.

The circuit board of the present invention is mounted with electronic components, and comprises wiring patterns on the board surface and protrusions disposed at desired locations on the wiring patterns. The protrusions are made of the same conductive material as used in the wiring patterns.

The semiconductor device of the present invention comprises the following elements:
(a) semiconductor chip components;
(b) a board;
(c) wiring patterns disposed on the board; and
(d) protrusions disposed at desired locations on the wiring patterns.

The protrusions are electrically coupled with electrodes provided to the semiconductor chips mounted on the board, and are made of the same conductive material as used in the wiring patterns.

The method of manufacturing the board of the present invention forms the wiring patterns and protrusions unitarily and simultaneously.

The construction according to the present invention allows the protrusions to be formed unitarily on the wiring patterns, so that the protrusions are always formed in the same shape, and respective electrical connections between the wiring patterns, protrusions and electronic components are ensured.

DESCRIPTION OF THE PREFERRED EMBODIMENTS

Exemplary embodiments of the present invention are described hereinafter with reference to the accompanying drawings.

(Exemplary Embodiment 1)

Figure 1:
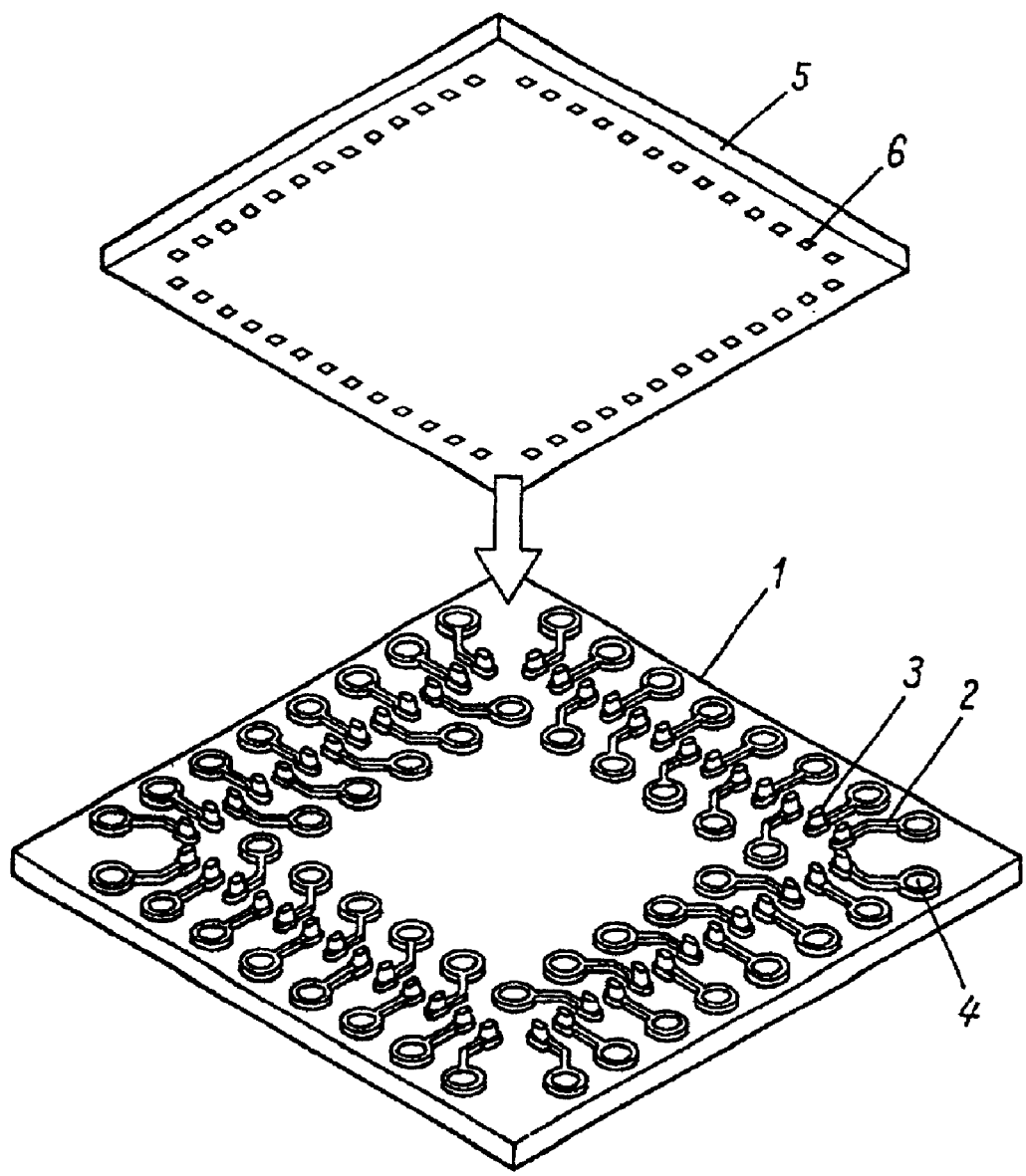
FIG. 1 is a perspective view illustrating construction of a circuit board and a semiconductor to be mounted on the board in accordance with a first exemplary embodiment of the present invention.

In FIG. 1, a plurality of electrodes 6 are formed on the periphery of a lower face of a semiconductor (bare chip) 5. In general, electrode 6 is made of aluminum plated with gold. The gold is plated in either an electrolytic way or a non-electrolytic way. In some cases, electrodes 6 are formed not only on the periphery but also near to the center of the lower face.

Figure 2:
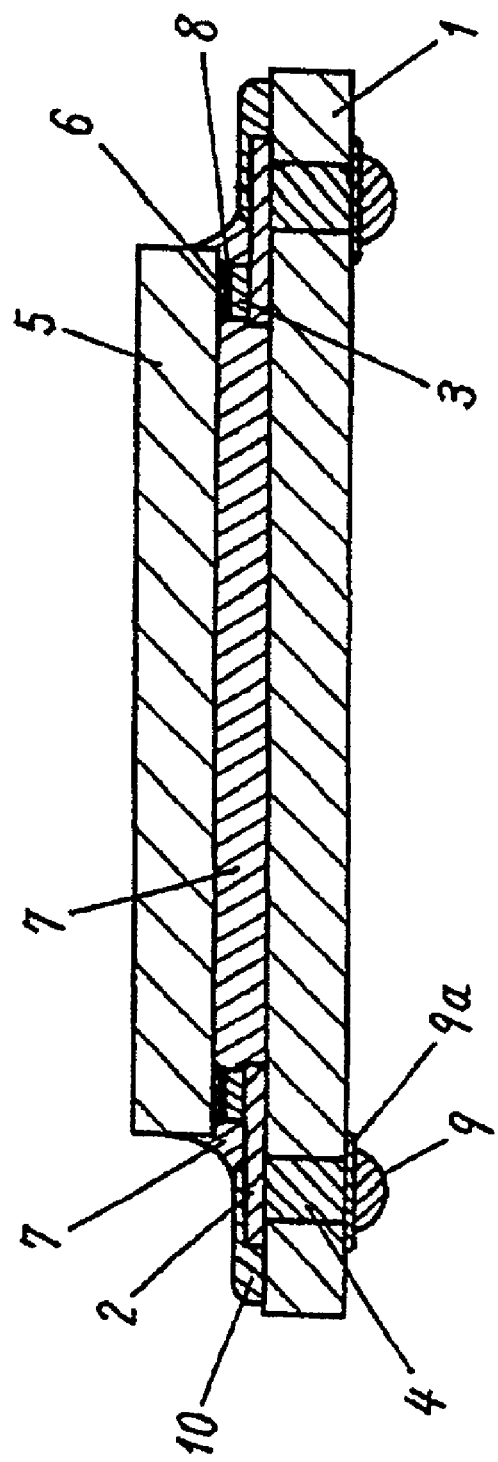
FIG. 2 is a cross section illustrating the semiconductor mounted to the circuit board in accordance with the first exemplary embodiment.

A plurality of wiring patterns 2 made of conductive materials such as Ag, Ag—Pd, or Cu are formed on the upper surface of circuit board 1 made of ceramic or glass-epoxy resin. As shown in FIG. 2, protrusion 3 is formed on a first end of wiring pattern 2 so that protrusion 3 is opposite to electrode 6 of semiconductor 5. When semiconductor 5 is mounted to circuit board 1, protrusion 3 is electrically coupled to electrode 6 via conductive paste 8 containing Ag—Pd or Ag.

In this exemplary embodiment, protrusion 3 is unitarily formed with wiring pattern 2 using the same material as used in wiring pattern 2. Conductive paste 8 is utilized to ensure the electrical contact between protrusion 3 and electrode 6, and it also relaxes thermal stress at the contacting section.

On a second end of wiring pattern 2, through-hole-electrode 4 is formed and a conductive paste made of Ag—Pd or Ag is filled therein. The presence of through-hole-electrode 4 thus couples electrically upper and lower surfaces of circuit board 1. Accordingly, wiring pattern 2 on the upper face can be coupled with ease to a mother board (not shown) via solder ball 9 disposed on electrode 9a made of aluminum or the like and disposed on the lower surface. Solder ball 9 is made of Pb, Sn or Ag.

In FIG. 1, protrusion 3 and through-hole-electrode 4 are formed on respective ends of wiring pattern 2. However, the locations of these two elements are unlimited and they can be formed any places on pattern 2, allowing wider free hand for designing wiring pattern 2. The components to be mounted are not limited to semiconductor 5, but chip components such as chip capacitors and chip resistors can be mounted. In other words, the circuit board of the present invention is not limited to a semiconductor board (device) but can be used as a general purpose circuit board.

In FIG. 2, sealant 7 made of epoxy resin and filled into a space between semiconductor 5 and circuit board 1 so that sealant 7 can cover the connecting section between protrusion 3 and electrode 6. Sealant 7 protects the connecting section. Insulating layer 10 made of glass paste or epoxy resin is disposed to cover wiring pattern 2, and protects wiring pattern 2. These arrangements ensure the reliability of the semiconductor device for a long time.

A method of forming the protrusions in accordance with the first exemplary embodiment is described hereinafter with reference to the accompanying drawings.

Figure 3A:
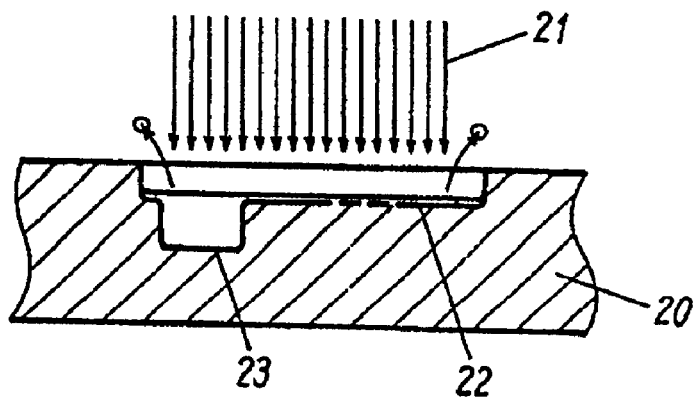
FIG. 3A, FIG. 3B and FIG. 3C illustrate steps of forming protrusions and wiring patterns in accordance with the first exemplary embodiment.
Figure 3B:
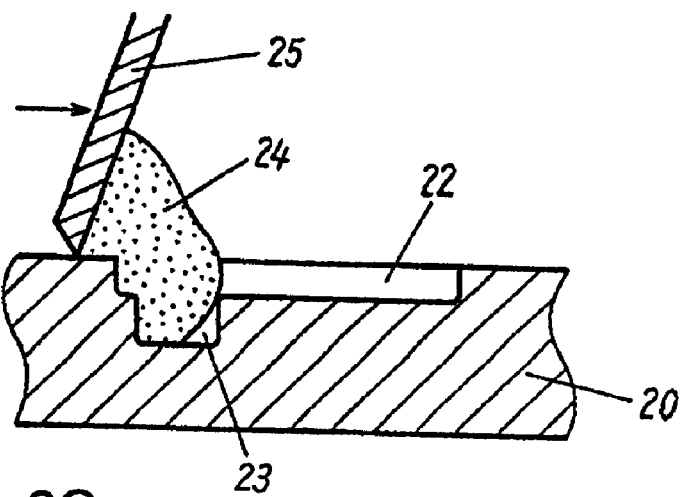
Figure 3C:
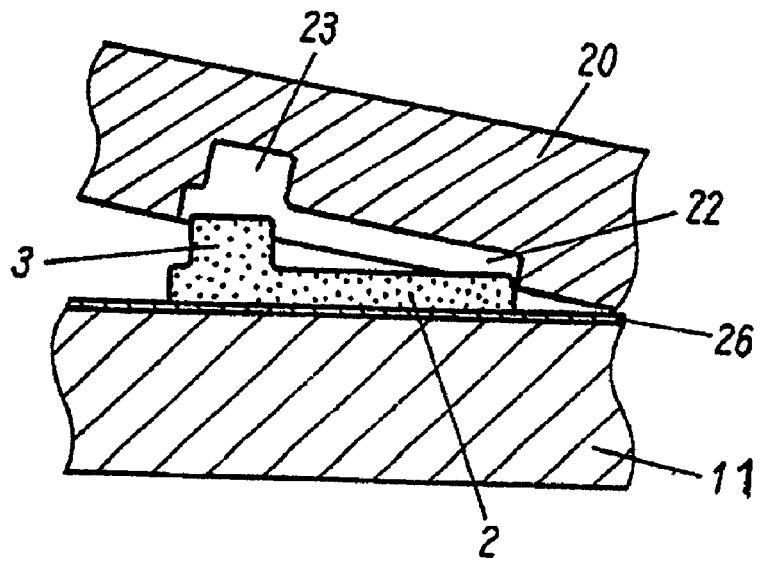

FIG. 3A, FIG. 3B, and FIG. 3C illustrate steps of forming protrusions 3. FIG. 3A depicts a step of forming a groove on a film 20, FIG. 3B depicts a step of filling conductive material 24. And, FIG. 3C depicts a step of transferring the conductive material 24 onto a board 11.

In FIG. 3A, first groove 22 and second groove 23 are formed on film 20 made of resin such as polyimide by scan-irradiation or area-irradiation of laser-beam 21 such as an excimer-laser, or $O_2$ laser.

In FIG. 3A, second groove 23 is formed deeper than first groove 22 by one of the following methods.

(a) greater numbers of laser irradiation to second groove 23 than first groove 22;

(b) greater power of laser irradiation to second groove 23 than first groove 22; or (c) using different mask patterns for laser irradiation.

In FIG. 3B, conductive material 24 made of Ag, Ag—Pd, Au or Cu is filled into first and second grooves 22 and 23 with squeegee 25 made of ceramic or silicone rubber.

Since second groove 23 is narrower and deeper than first groove 22, various means are employed to fill second groove 23 with conductive material 24, such as repeating the fill-up operations, filling-up using centrifugal force, or using smaller size fillers included in conductive material 24. Second groove 23 is thus filled with conductive material 24 efficiently and perfectly.

In FIG. 3C, bonding layer 26 is formed on board 11. Film 20 discussed previously is adhered to an upper face of bonding layer 26, and then peeled off, so that conductive material 24 filled in grooves 22 and 23 are transferred onto board 11. Transferred conductive material 24 is fired at approximate 850° C. so that it is sintered into one body. The conductive material filled in first groove 22 turns to wiring pattern 2 on board 11, and that in second groove 23 turns to protrusion 3.

Bonding layer 26 has been uniformly applied to entire board 11 before film 20 is adhered to bonding layer 26 so that conductive material 24 filled in grooves 22 and 23 can be peeled off from film 20 free from deformation. Bonding layer 26 is vaporized by the firing after transferring conductive material 24 on board 11.

Another peeling off method is to utilize a difference of thermal expansion coefficients between board 11 and film 20. For instance, when the thermal expansion coefficient of board 11 is greater than that of film 20, film 20 shrinks less than board 11 when heated and cooled. Due to this difference, film 20 can be peeled off board 11 with ease.

As discussed above, according to the first exemplary embodiment, wiring pattern 2 on board 11 and protrusion 3 used for mounting semiconductor 5 are simultaneously formed in a plurality of places in bulk. This reduces the numbers of manufacturing steps for the circuit board. Further, the dispersion of protrusion-heights can be limited to the dispersion range of groove depth on film 20. The heights of protrusions 3 are leveled out, so that the electrical connection between semiconductor 5 and circuit board 1 is ensured.

The dispersion of grooves' depth on film 20 by an excimer laser is not more than 3 mm which is negligible for the electrical coupling of semiconductor 5 and circuit board 1. The grooves are formed by a laser in this embodiment. However, etching or molding is applicable for forming the grooves.

(Exemplary Embodiment 2)

Another method of coupling electrode 6 of semiconductor 5 to protrusion 3 is described hereinafter with reference to FIG. 4.

Figure 4:
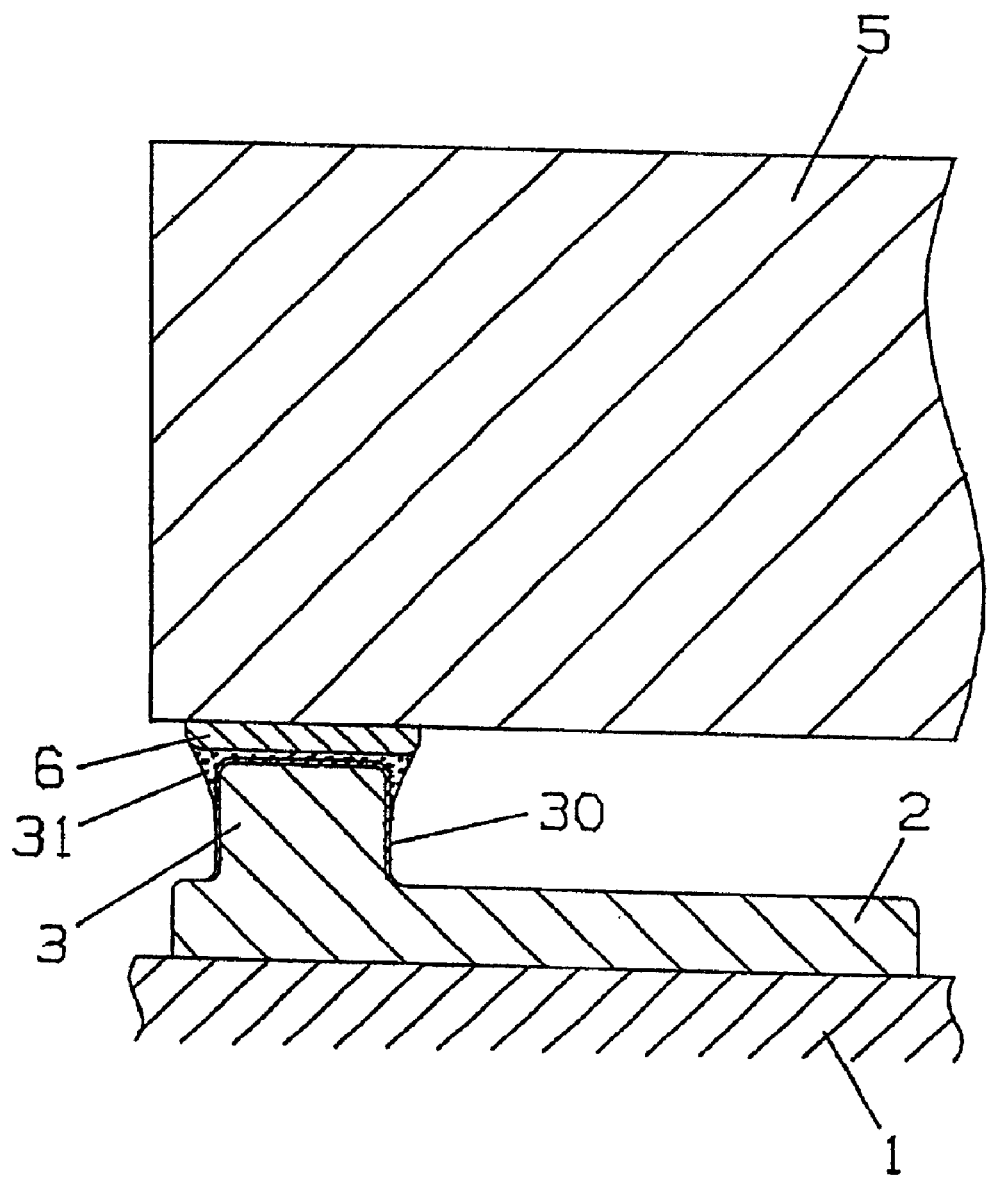
FIG. 4 is a partial cross section illustrating a semiconductor mounted to a circuit board in accordance with a second exemplary embodiment of the present invention.

FIG. 4 is a partial cross section illustrating a semiconductor mounted to a circuit board in accordance with the second exemplary embodiment of the present invention. The same elements used in the first exemplary embodiment are denoted with the same reference numbers, and the descriptions thereof are omitted here.

In FIG. 4, on the surface of protrusion 3, which is unitarily formed with wiring pattern 2 by the same method as the first exemplary embodiment, thin protection layer 30 made of Au or conductive resin is formed. This protection layer is coupled with the surface of electrode 6 via conductive paste 31 containing Ag or Ag—Pd.

Forming the same protection layer 30 on the surface of electrode 6 increases the reliability at the coupling section.

The electrical contact between protrusion 3 and electrode 6 is ensured, and employing material such as Ag—Pd having low resistance value as conductive paste 31 allows the semiconductor device to accommodate a higher frequency.

Figure 5:
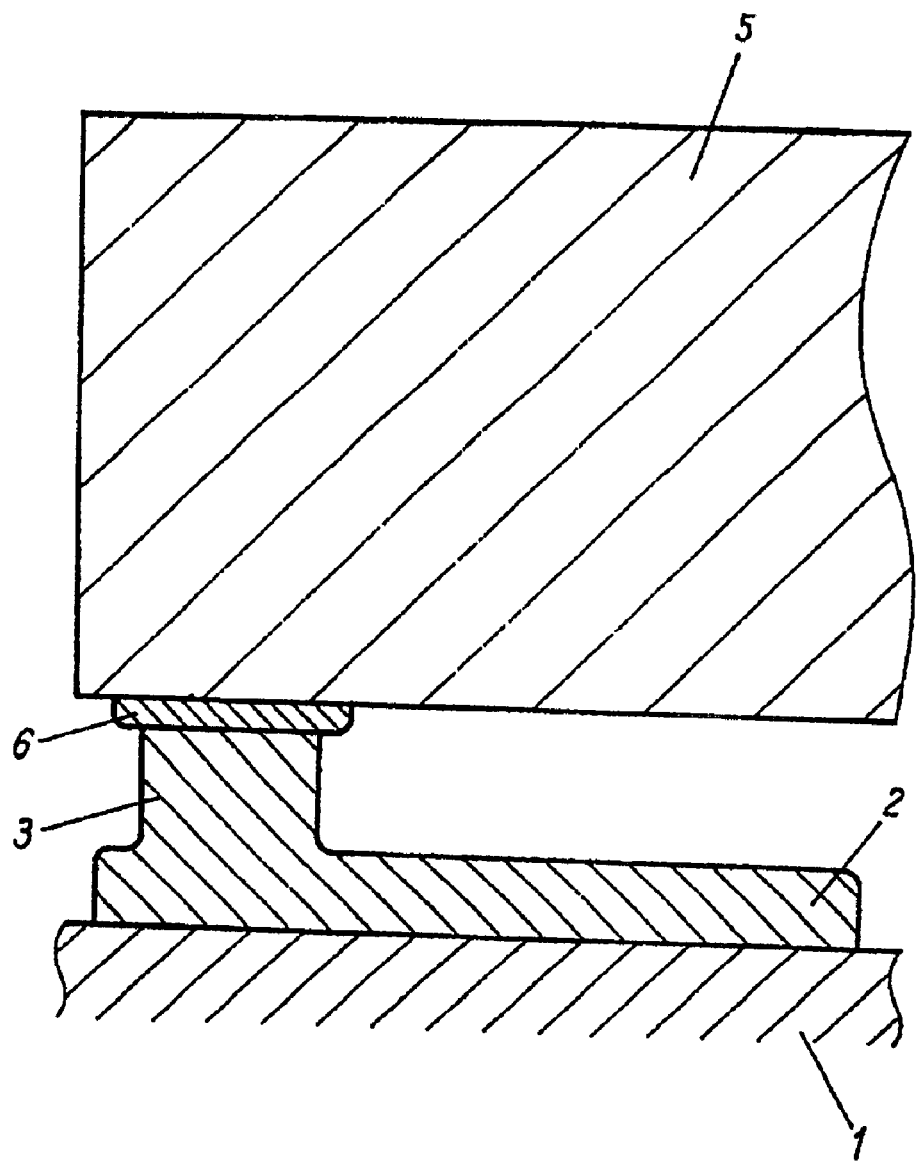
FIG. 5 is a partial cross section illustrating another example in accordance with the second exemplary embodiment.

Still another method of coupling electrode 3 to electrode 6 is shown in FIG. 5. Protrusion 3 is formed by Au paste, and electrode 6 is formed by Al. Then, an ultrasonic wave is applied to the coupling section, where heat is generated locally and is activated. As a result, protrusion 3 and electrode 6 are coupled.

This method produces eutectic bonding between Au and Al at the coupling section of protrusion 3 and electrode 6, and ensures electrical coupling without a bonding layer such as solder and the like.

(Exemplary Embodiment 3)

A method of coupling protrusion 3 to electrode 6, different from the first and second exemplary embodiments, is described hereinafter with reference to FIG. 6.

Figure 6A:
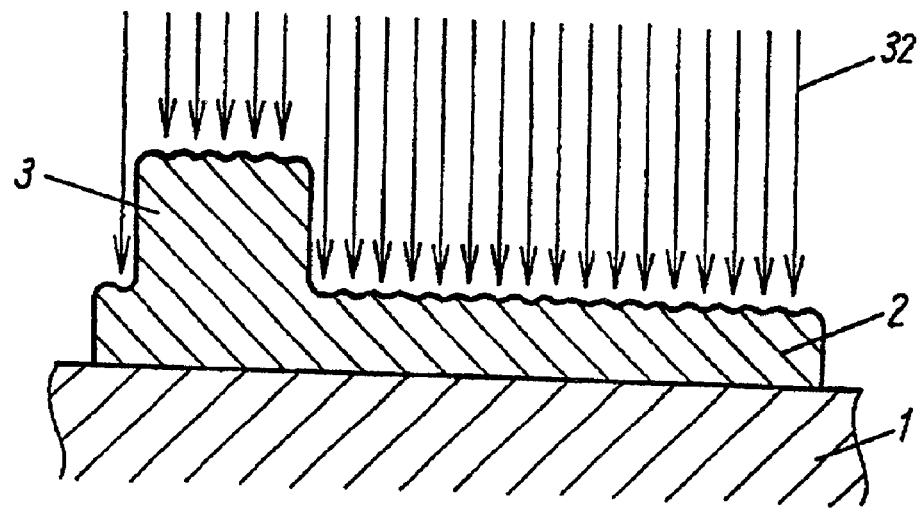
FIG. 6A and FIG. 6B illustrate steps of mounting a semiconductor to a circuit board in accordance with a third exemplary embodiment of the present invention.
Figure 6B:
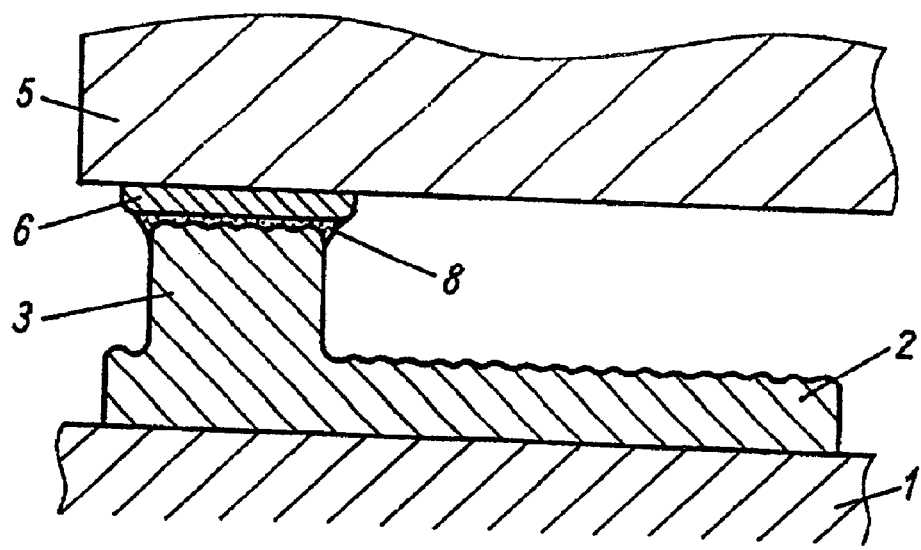

FIG. 6A and FIG. 6B illustrate steps of mounting a semiconductor to a circuit board in accordance with the third exemplary embodiment of the present invention. The same elements used in the first exemplary embodiment are denoted with the same reference numbers, and the descriptions thereof are omitted here.

As shown in FIG. 6A, wiring pattern 2 and protrusion 3 are unitarily formed on circuit board 1 by the same method of the first embodiment. Blast-powder-flow is applied to pattern 2 and protrusion 3, or to the entire circuit board on which pattern 2 and protrusion 3 are formed so that the surface thereof can be roughened and cleaned. In other words, the blasting removes an oxide film from the surface of protrusion 3 and cleans the surface, which can eliminate protection layer 30 formed on protrusion 3 as described in the second embodiment (FIG. 4.) As a result, as shown in FIG. 6B, respective contacting areas between conductive paste 8, electrode 6 and protrusion 3 are increased, and adhesive force therebetween is strengthened. Further, adhesive between sealant 7 and circuit board 1 is strengthened due to an anchor effect. In this embodiment, the blasting is employed to roughen and clean the surfaces of circuit board 1 and protrusion 3. However, etching can also effect the same result. The surface roughening employed in this embodiment is applicable to the metal bonding and eutectic bonding described in the second embodiment, and they can produce the same effect.

(Exemplary Embodiment 4)

The present invention is applicable to a multi-layered circuit board, which is described hereinafter with reference to FIG. 7. The same elements used in the first exemplary embodiment are denoted with the same reference numbers, and the descriptions thereof are omitted here.

Figure 7:
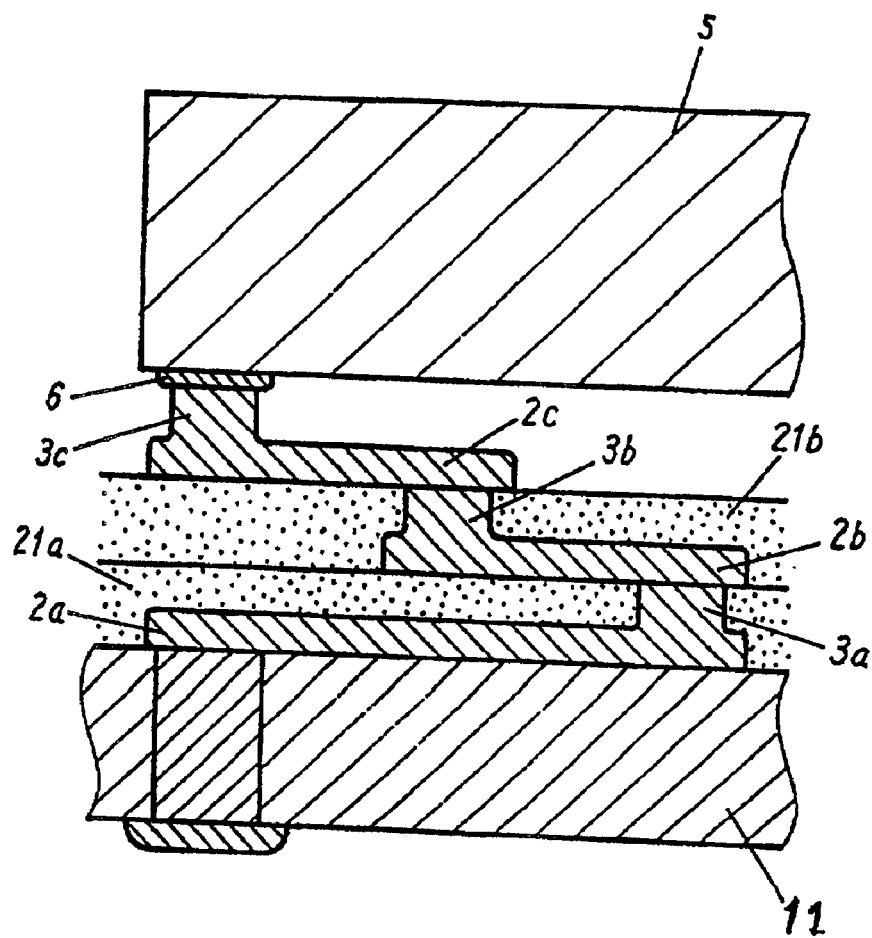
FIG. 7 is a cross section illustrating a construction of a multi-layered-circuit-board in accordance with a fourth exemplary embodiment.
Figure 8:
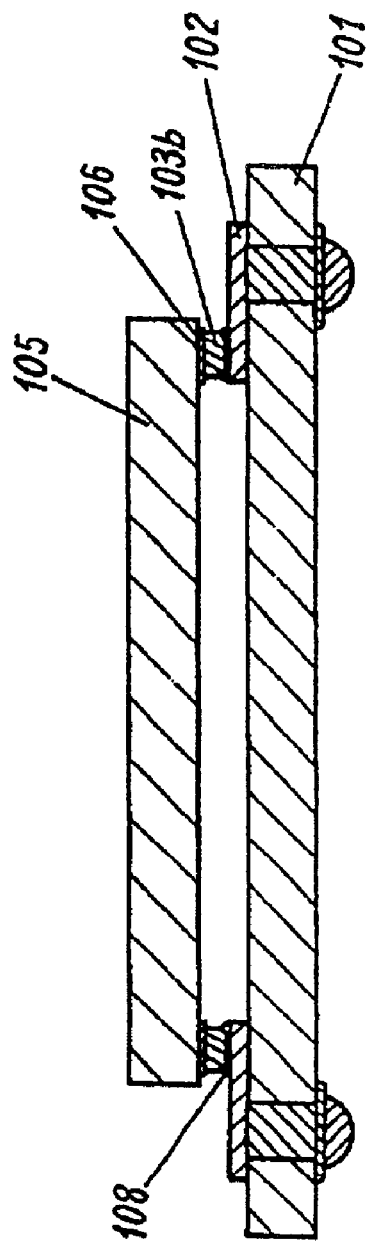
FIG. 8 is a cross section illustrating a conventional semiconductor device.
Figure 9:
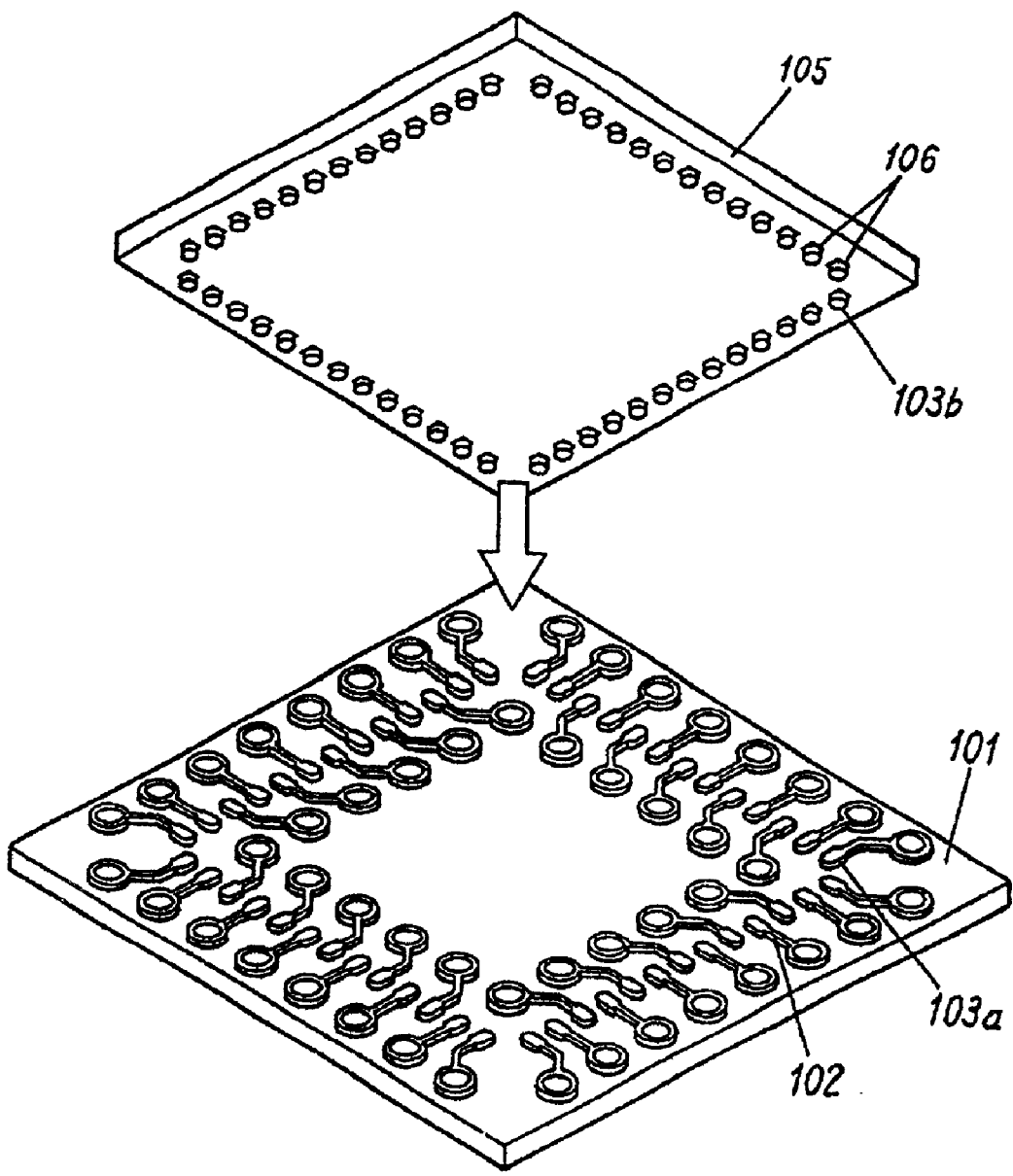
FIG. 9 is a perspective view illustrating constructions of a conventional circuit board and a conventional semiconductor to be mounted to the board.
Figure 10:
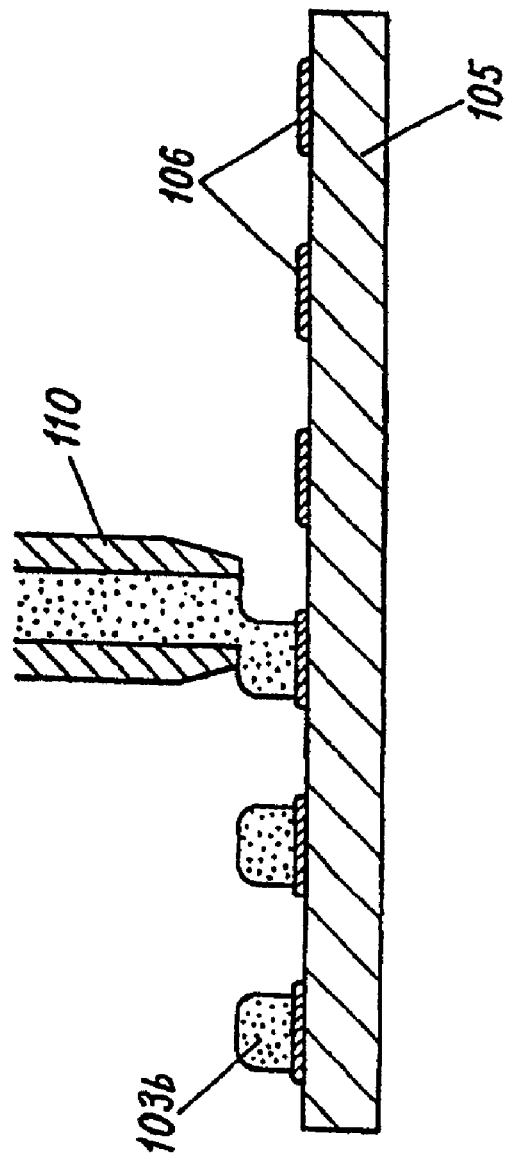
FIG. 10 is a cross section illustrating a conventional method of forming protrusions.

FIG. 7 is a cross section illustrating a construction of a multi-layered circuit board in accordance with the fourth exemplary embodiment. In FIG. 7, wiring pattern 2a and protrusion 3a are formed on board 11 by the same method as the first exemplary embodiment. Insulating layer 21a is formed on an upper face of pattern 2a and protrusion 3a, then layer 21a is polished and leveled off. Another wiring pattern 2b and protrusion 3b are formed so that they are electrically coupled to protrusion 3a exposed from insulating layer 21a. Another insulating layer 21b is formed thereon, then polished and leveled off. Still another wiring pattern 2c and protrusion 3c are formed so that they are electrically coupled to protrusion 3b exposed from insulating layer 21b. The multi-layered circuit board is produced. The steps discussed above are repeated so that any number of layers can be added, and a circuit board with component mounting in high density can be obtained.

In this embodiment, the insulating layer is polished every time it is formed so that warp can be corrected and failures in electrical connection between respective layers can be reduced.

(Exemplary Embodiment 5)

A method of coupling protrusion 3 and electrode 6 of semiconductor 5, different from that in the previous embodiments, is described hereinafter with reference to FIG. 11.

Figure 11:
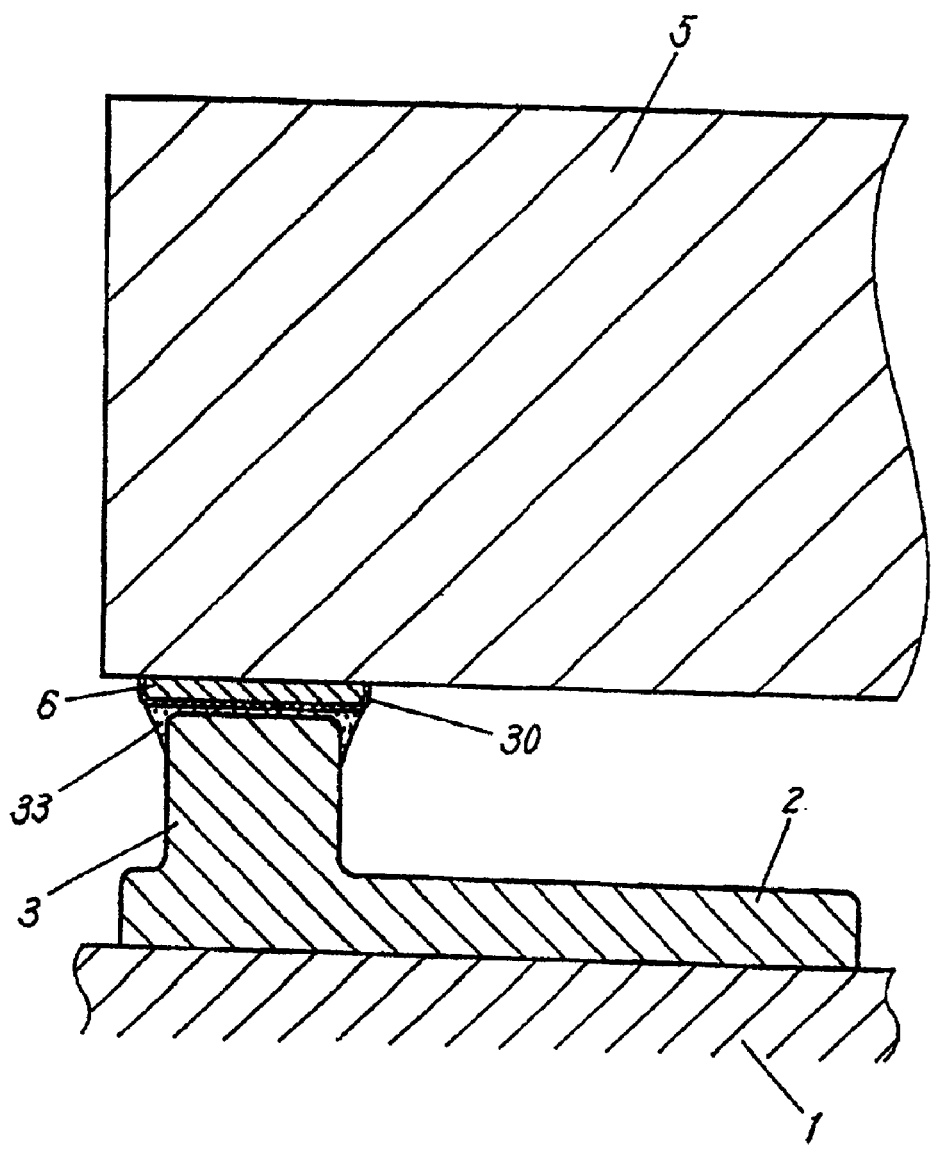
FIG. 11 is a partial cross section illustrating a semiconductor mounted to a circuit board in accordance with a fifth exemplary embodiment of the present invention.

FIG. 11 is a partial cross section illustrating a semiconductor mounted to a circuit board in accordance with the fifth exemplary embodiment of the present invention. The same elements used in the first exemplary embodiment are denoted with the same reference numbers, and the descriptions thereof are omitted.

In FIG. 11, wiring pattern 2 and protrusion 3 are unitarily formed by the same method as the first embodiment. On the surface of electrode 6, Au-plated layer 30 is formed and coupled to protrusion 3 via solder 33 made of Pb—Sn or Ag—Sn.

Protrusion 3 and electrode 6 are coupled in a metal bonding manner by solder 33. This coupling ensures an electrical contact with low resistance and allows the semiconductor device to accommodate a higher frequency.

Figure 12:
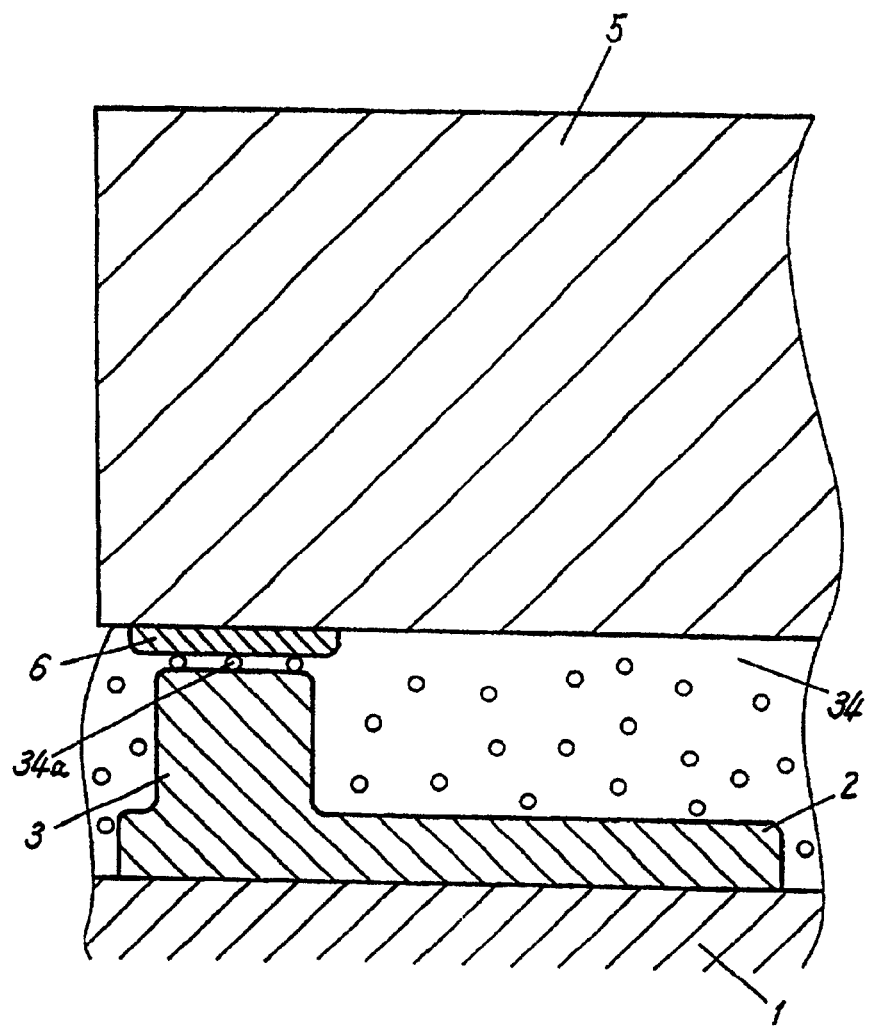
FIG. 12 is a partial cross section illustrating a semiconductor mounted to a circuit board in accordance with a fifth exemplary embodiment of the present invention.

Another method of coupling protrusion 3 and electrode 6 is shown in FIG. 12, i.e. anisotropic conductive resin 34 is used for the coupling.

When anisotropic conductive resin 34 is used, conductive particles 34a connects electrically protrusion 3 to electrode 6, and at the same time, resin component of anisotropic conductive resin 34 can seal the space between semiconductor 5 and circuit board 1. The conventional step of sealing with resin can be eliminated, and a better connection with a higher reliability can be realized.

Another method of coupling protrusion 3 and electrode 6 is available, i.e. protrusion 3 is plated with Au or formed by Au paste, and electrode 6 is plated with Au. Then an ultrasonic wave is applied to the coupling section of these two elements. This method couples the two elements in an Au—Au bonding manner, so that they are coupled with a lower resistance free from a bonding layer made of solder.

(Exemplary Embodiment 6)

A method of coupling protrusion 3 to electrode 6 of semiconductor 5, different from the previous embodiments, is described hereinafter with reference to FIG. 13.

Figure 13:
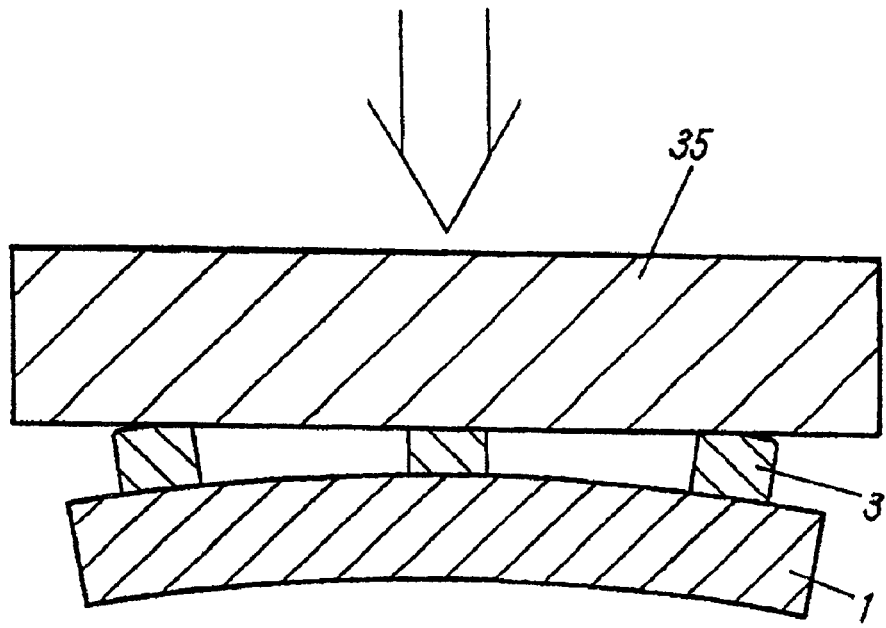
FIG. 13 illustrates how to level out the heights of protrusions in accordance with a sixth exemplary embodiment of the present invention.

FIG. 13 illustrates how to level out the heights of protrusions in accordance with the sixth exemplary embodiment of the present invention. The same elements used in the first exemplary embodiment are denoted with the same reference numbers, and the descriptions thereof are omitted.

Protrusion 3 and wiring pattern 2 (not shown) are unitarily formed on circuit board 1 by the same method as the first embodiment. As shown in FIG. 13, a load is imposed on protrusions 3 with flat face 35, e.g. metallic plate so that the heights of protrusions 3 are leveled off, whereby the height dispersion of protrusions 3 can be reduced. This also reduces the space dispersion between the electrodes of the semiconductor and the protrusions, and the electrical contact can be further ensured.

Figure 14:
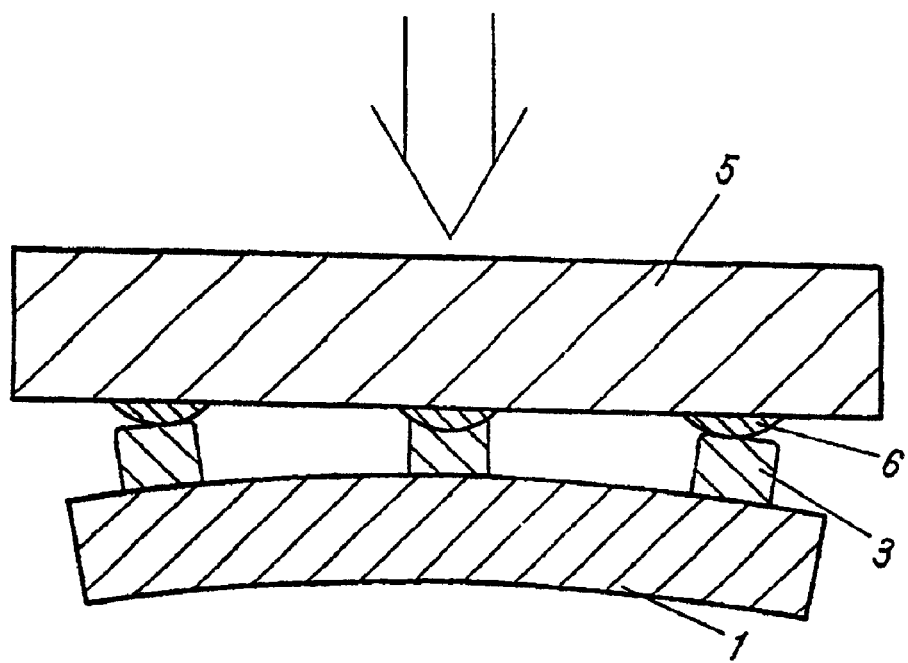
FIG. 14 illustrates a second way to level out the heights of protrusions in accordance with a sixth exemplary embodiment of the present invention.

Instead of using the flat plate, e.g. a metallic plate, for leveling off the heights of protrusions 3, a load is imposed to the protrusions by electrodes 6 of semiconductor to be mounted, as shown in FIG. 14, so that the heights of protrusions can be leveled off.

This method allows the height dispersion of protrusions 3 to accord with that of electrodes 6, so that the space dispersion between protrusions 3 and electrodes 6 are minimized. The contact can be further ensured. When a film, made of solder of which thickness-dispersion is rather great, is formed, this method is particularly effective.

(Exemplary Embodiment 7)

A method of coupling protrusion 3 to electrode 6 of semiconductor 5, different from the previous embodiments, is described hereinafter with reference to FIG. 15 and FIG. 16.

Figure 15:
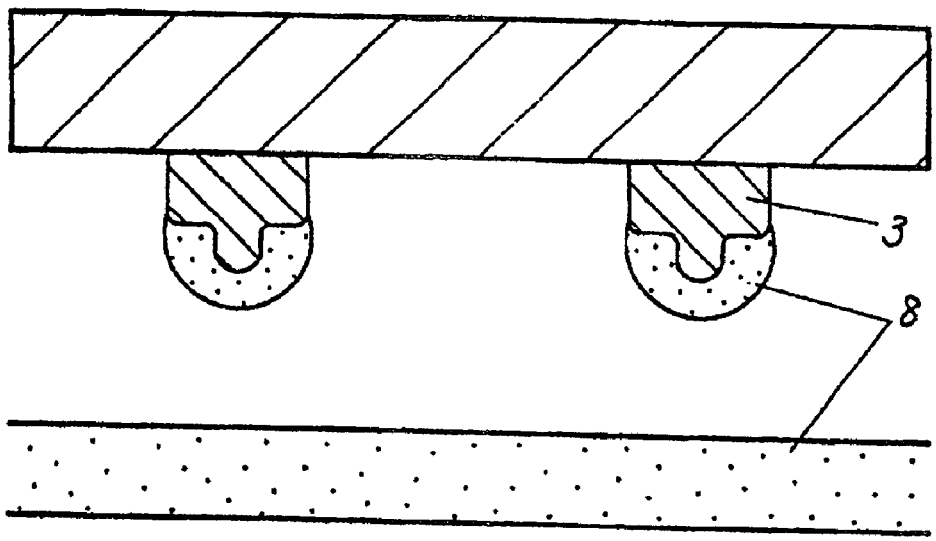
FIG. 15 illustrates electrodes on which conductive paste is applied in accordance with a seventh exemplary embodiment.

FIG. 15 illustrates protrusion 3 on which a conductive paste is applied in accordance with the seventh exemplary embodiment. FIG. 16 illustrates protrusion 3, having a general shape, is applied by conductive paste. The same elements used in the first exemplary embodiment are denoted with the same reference numbers, and the descriptions thereof are omitted.

Figure 16:
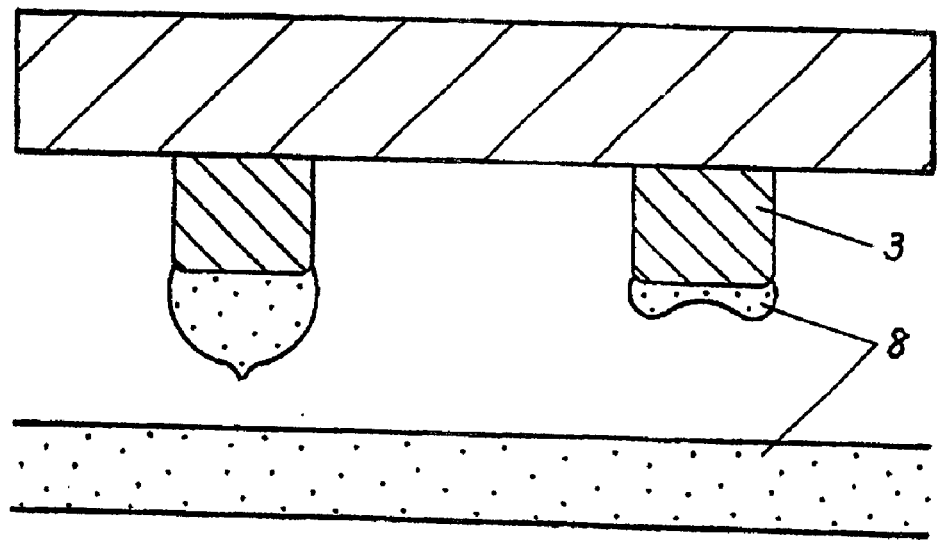
FIG. 16 illustrates electrodes, having a conventional protrusion shape, is applied by conductive paste.

As shown in FIG. 16, when protrusion 3 has a general cylindrical shape, conductive paste 8 adheres to the end face of protrusion 3, which produces the quantity dispersion of applied paste. The electrical contact of a protrusion with an electrode becomes unstable. On the other hand, when protrusion 3 forms a hill on its end, conductive paste 8 adheres to the hill as shown in FIG. 15. This method can avoid quantity dispersion of the applied paste on electrode 6, and ensures the electrical contact of protrusion 3 with the electrode of semiconductor.

As the embodiments discussed above show, according to the present invention, protrusions on the pattern can be formed by the same conductive material of the wiring pattern, which ensures the electrical contact of the protrusions to the wiring pattern. As a result, electrodes of the components to be mounted can be coupled to the protrusions with high reliability.

Further, when a wiring pattern is formed on a board, protrusions can be formed in bulk simultaneously. Productivity is greatly improved, and at the same time, the shapes of protrusions are uniformed, which ensures the electrical contact of the wiring pattern to the electrodes of semiconductor.

What is claimed is:

1. A method of manufacturing a circuit board comprising a plurality of wiring patterns each extending across a surface of an insulating substrate for connecting at least two locations on the substrate, and a plurality of protrusions located at desired locations on the wiring patterns, the method comprising:

simultaneously and unitarily forming the wiring patterns and the protrusions.

2. The method of manufacturing a circuit board as defined in claim 1, wherein the wiring patterns and the protrusions are made of a same conductive sintered material.

3. The method of manufacturing a circuit board as defined in claim 2 additionally comprising:

forming a first groove on a film;

forming a second groove at a desired location in the first groove;

filling conductive material into the first and the second grooves;

transferring the filled conductive material to the board; and firing the transferred conductive material.

4. The method of manufacturing a circuit board as defined in claim 3 further comprising:

roughening at least part of a surface of the circuit board by one of chemical processing and mechanical processing.

5. The method of manufacturing a circuit board as defined in claim 4 further comprising:

roughening an end surface of a protrusion opposite the circuit board by one of an etching process and a blast process.

6. The method of manufacturing a circuit board as defined in claim 1, further comprising modifying the protrusions to have substantially equal heights.

7. The method of manufacturing a circuit board as defined in claim 6, wherein said modifying comprises imposing a load on said protrusions.

8. A method of manufacturing a semiconductor device comprising the steps of:

simultaneously and unitarily forming a first plurality of wiring patterns and a second plurality of protrusions located at desired locations on the wiring patterns on an insulating substrate, the protrusions having substantially equal heights, the wiring patterns each extending across a surface of the substrate for connecting at least two locations on the substrate; and coupling electrically the protrusions and electrodes disposed on a semiconductor chip component.

9. The method of manufacturing a semiconductor device as defined in claim 8, wherein the wiring patterns the protrusions are made of a same conductive sintered material.

10. The method of manufacturing a semiconductor device as defined in claim 9 wherein forming the wiring patterns and the protrusions of the same conductive material comprises:

forming a first groove on a film;

forming a second groove at a desired location in the first groove;

filling conductive material into the first and the second grooves;

transferring the filled conductive material onto the circuit board; and firing the transferred conductive material.

11. The method of manufacturing a semiconductor device as defined in claim 10 further comprising:

roughening at least an end surface of the protrusion by providing one of a chemical processing and a mechanical processing to the circuit board on which the protrusions and the wiring patterns are formed.

12. The method of manufacturing a semiconductor device as defined in claim 11 wherein:

the chemical processing is etching, and the mechanical processing is blasting.

13. The method of manufacturing a semiconductor device as defined in claim 8 further comprising:

leveling the protrusion by imposing load thereto with one of a flat metallic plate and the electrode of a semiconductor chip component, before electrically coupling the protrusion on said circuit board and the electrodes on said semiconductor chip component.

* * * * *